United States Patent

Yindeepol et al.

[11] Patent Number: 5,811,315
[45] Date of Patent: Sep. 22, 1998

[54] METHOD OF FORMING AND PLANARIZING DEEP ISOLATION TRENCHES IN A SILICON-ON-INSULATOR (SOI) STRUCTURE

[75] Inventors: Wipawan Yindeepol, San Jose; Joel McGregor, Los Altos; Rashid Bashir, Santa Clara; Kevin Brown, Sunnyvale; Joseph Anthony DeSantis, San Jose, all of Calif.

[73] Assignee: National Semiconductor Corporation, Santa Clara, Calif.

[21] Appl. No.: 816,408

[22] Filed: Mar. 13, 1997

[51] Int. Cl.$^6$ .................................. H01L 21/76
[52] U.S. Cl. .................. 437/62; 437/67; 437/228; 437/72; 148/DIG. 50
[58] Field of Search ................ 437/62, 63, 64, 437/67, 72, 228 TR; 148/DIG. 50

[56] References Cited

U.S. PATENT DOCUMENTS

| | | |
|---|---|---|
| 5,017,998 | 5/1991 | Miura et al. . |
| 5,217,919 | 6/1993 | Gaul et al. . |
| 5,223,736 | 6/1993 | Rodder . |
| 5,250,836 | 10/1993 | Miura et al. . |
| 5,372,968 | 12/1994 | Lur et al. . |
| 5,385,861 | 1/1995 | Bashir et al. . |
| 5,416,041 | 5/1995 | Schwalke . |
| 5,445,988 | 8/1995 | Schwalke . |
| 5,470,782 | 11/1995 | Schwalke et al. .................. 437/67 |
| 5,480,832 | 1/1996 | Miura et al. ..................... 437/62 |

Primary Examiner—Trung Dang
Attorney, Agent, or Firm—Limbach & Limbach LLP

[57] ABSTRACT

A method of forming and planarizing a deep isolation trench in a silicon-on-insulator (SOI) structure begins with a base semiconductor substrate, a buried insulator layer formed on the base semiconductor substrate, and an active silicon layer formed on the buried insulator layer. First, an ONO layer is formed on the active silicon layer. The ONO layer includes a layer of field oxide, a first layer of silicon nitride and a layer of deposited hardmask oxide. A trench having sidewalls that extend to the buried oxide layer is formed. A layer of trench lining oxide is then formed on the exposed sidewalls of the trench. Then, a second layer of silicon nitride is conformally formed on the substrate. The second nitride layer is then anisotropically etched to remove the nitride from the exposed horizontal surface of the hardmask oxide and the buried oxide in the bottom of the trench, but leaving silicon nitride on the vertical sidewall portions of the hardmask oxide, on the sidewalls of the first nitride layer on the sidewalls of the field oxide and on the trench lining oxide. A layer of polysilicon is then deposited to fill the trench and etched back such that the top surface of the polysilicon substantially corresponds to the top surface of the layer of field oxide. The hardmask oxide layer is then removed and the top surface of the polysilicon layer is oxidized.

20 Claims, 10 Drawing Sheets

METHOD OF FORMING AND PLANARIZING DEEP ISOLATION TRENCHES IN A SILICON-ON-INSULATOR (SOI) STRUCTURE

BACKGROUND OF THE INVENTION

1. Field of the Invention

The present invention relates to fabrication of integrated circuit devices and, in particular, to methods of forming deep trenches in silicon-on-insulator (SOI) structures without seriously degrading either the buried oxide or the field oxide on top of the wafer while obtaining planarization of the trenches. The method may be utilized in the fabrication of CMOS, BiCMOS and bipolar devices.

2. Description of the Related Art

It is often desirable, particularly in high-voltage applications, to completely electrically insulate neighboring components or component groups from one another in an integrated circuit structure. One way to accomplish this is by utilizing a "buried" horizontal insulating layer and vertical trenches in the active silicon that intersect with the insulating layer to completely surround the high-voltage components.

Figure 1:
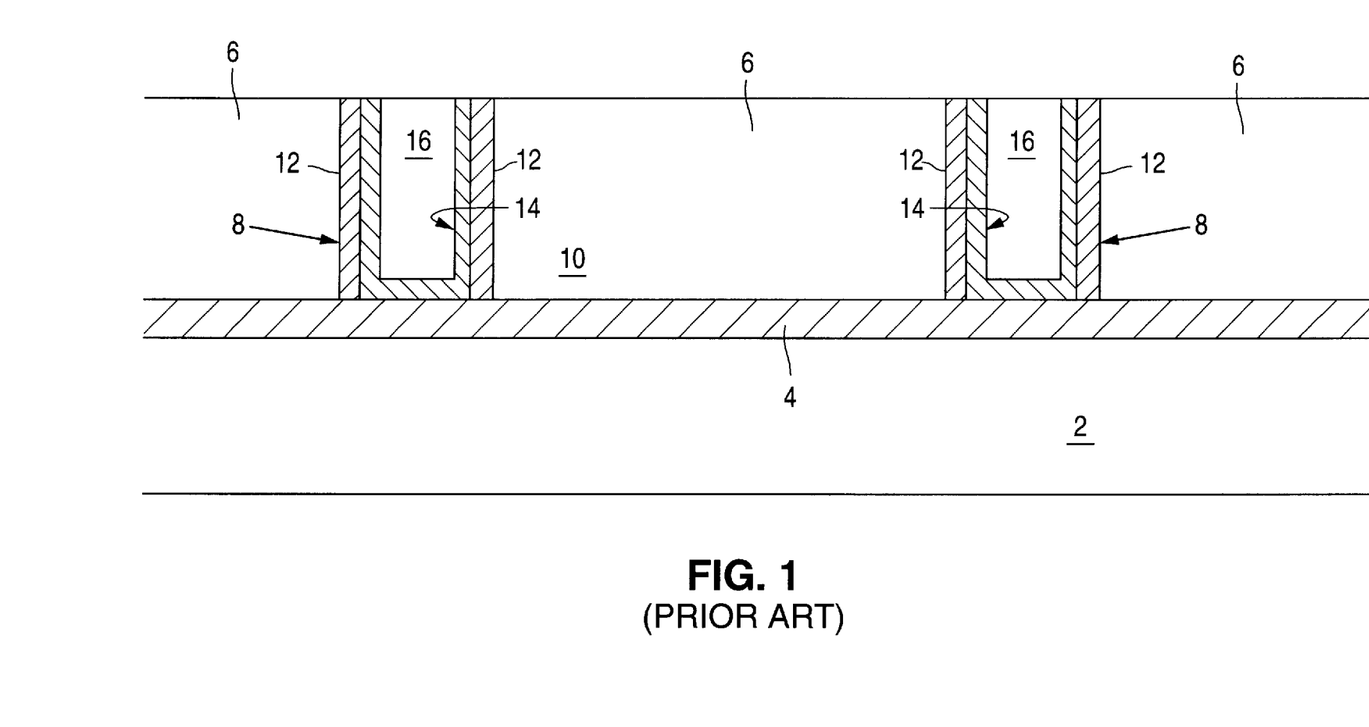
FIG. 1 is a simple cross-sectional drawing illustrating a conventional silicon-on-insulator (SOI) structure.

FIG. 1 shows a silicon-on-insulator (SOI) structure that includes a base silicon substrate 2 with a buried insulator layer 4, typically oxide, formed on its upper surface. An active bonded silicon layer 6 is formed on the buried insulator layer 4. Deep isolation trenches 8 are formed from the surface of the active bonded silicon layer 6 to the buried insulator layer 4, thereby electrically insulating a portion 10 of the active bonded silicon layer 6 from the remainder of the structure.

Typically, the deep isolation trenches 8 include a layer of lining oxide 12 formed on the sidewalls of the openings in the active bonded silicon layer 6 and may also include a nitride layer 14 formed over the lining oxide 12. A layer of polysilicon 16 is formed to fill the remainder of the trenches 8 and then etched back to planarize the trench surface.

In some high-voltage applications, to meet the breakdown voltage requirements for these applications, the active silicon layer 6 can include a layer of epitaxial-grown silicon that is greater than 20 microns thick. This means that the isolation trenches 8 have to be etched all the way through the epi thickness down to the buried oxide layer 4 to achieve isolation.

Thus, there is a need for a method of forming trench isolation structures in which the trench etch, fill and planarization scheme results in trenches that are greater than 20 microns deep and 2 microns wide, geometries typically applicable for high-voltage applications of the type described above. It is important that the trench process does not cause debonding of the active bonded silicon from the underlying buried oxide 4 and that the trenches 8 are planarized such that the polysilicon etch step does not leave polysilicon stringers. Further, the planarization must be such that final metal etch steps to complete the device structure also leave no stringers. In addition, the field oxide formed prior to trench etch must be protected and should not be etched during trench processing.

SUMMARY OF THE INVENTION

The present invention provides a method of forming and planarizing a deep isolation trench in a silicon-on-insulator (SOI) structure wherein the SOI structure includes a base semiconductor substrate, a buried insulator layer formed on the base semiconductor substrate, and an active silicon layer formed on the buried insulator layer. According to a preferred method, an oxide/nitride/oxide (ONO) layer is first formed on the active silicon layer. The ONO layer includes field oxide, which, if the active silicon layer is 20–25 microns thick, is typically grown to be about 10,000 Å thick by local oxidation of silicon (LOCOS), a first layer of low-pressure chemical vapor deposition (LPCVD) silicon nitride about 2,000 Å thick, and a layer of deposited hardmask oxide (LTO or TEOS, for example) about 29,000 Å thick. A layer of photoresist is then formed on the deposited hardmask oxide layer and patterned to expose a portion of the underlying hardmask oxide. The exposed portion of the hardmask oxide is then anisotropically etched through the upper oxide layer, the underlying layer of LPCVD silicon nitride and the underlying layer of field oxide to expose a surface portion of the active silicon layer. The chemistry utilized to etch these three layers is selective to silicon. The photoresist is then stripped and the hardmask oxide is used as a mask for anisotropically etching the exposed portion of the active silicon layer to form a trench having vertical sidewalls that extend down to the layer of buried oxide. The anisotropic etch is carried out such that the oxide hardmask maintains a vertical sidewall portion that corresponds to the vertical sidewalls of the trench. Next, a layer of sacrificial oxide about 600–700 Å thick is grown on the sidewalls of the trench and then removed. This step removes any damage caused by the anisotropic etch. Following removal of the sacrificial oxide, a layer of trench lining oxide about 1,000–5,000 Å thick is formed on the exposed sidewalls of the trench. Then, a second layer of LPCVD silicon nitride about 1,000–3,000 Å thick is deposited on the exposed surfaces of the hardmask oxide, the exposed sidewall of the first LPCVD nitride layer, the exposed sidewall of the layer of field oxide, on the layer of trench lining oxide and on the bottom of the trench. The second layer of LPCVD nitride is then anisotropically etched to remove the nitride from all horizontal exposed surfaces of the hardmask oxide and from the buried oxide at the bottom of the trench, but not from the vertical surfaces of the hardmask oxide, the first LPCVD nitride sidewall, the field oxide sidewall and the lining oxide on the sidewalls of the active silicon trench. A layer of polysilicon is then deposited to fill the trench and etched back. Ideally, the etchback is such that a subsequent oxidation of the trench poly results in a polyoxide cap that is planar with the layer of field oxide. Following the poly etchback, the hardmask oxide layer is removed and the trench poly is oxidized. Finally, the first layer of LPCVD silicon nitride is removed, resulting in an SOI structure that may then be moved on to subsequent process steps.

In an alternative process flow in accordance with the invention, the hardmask oxide is removed before the poly fill and etchback steps so that the poly is deposited on an even surface for better poly etchback control. Hardmask oxide removal prior to trench fill, and without disturbing the buried oxide, is facilitated by modifying the nitride spacer etch step using concepts of reactive ion etching (RIE) "lag" to leave nitride at the bottom of the trench, thereby protecting the buried oxide.

In another alternative flow, the nitride is stripped after hardmask oxide removal to remove the nitride "bat ears" from the structure, but then a new layer of nitride is deposited in the trench prior to poly trench fill.

In still another alternative flow, the nitride is completely stripped after hardmask oxide removal, rather than at the end of the process, so that there is no nitride lining in the trench to possibly cause stress and defects.

Additionally, each of the disclosed process flows may be modified to add a separate isotropic trench etch step after the trench has been defined or add a small isotropic component to the trench etch itself, or adjust the amount of trench sidewall consumption with sacrificial oxide thickness, or any combination of all three, to produce an optimized vertical sidewall upon growth of the trench lining oxide, thus avoiding nitride etch-through problems during the anisotropic etching of the second LPCVD nitride.

A better understanding of the features and advantages of the present invention will be obtained by reference to the following detailed description and accompanying drawings which set forth several illustrative embodiments in which the principles of the invention are utilized.

DETAILED DESCRIPTION OF THE INVENTION

Figure 2A:
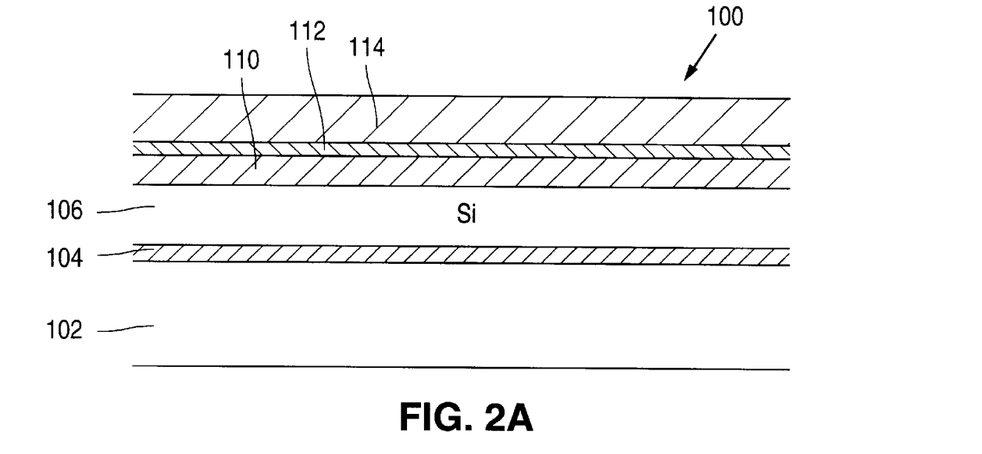
FIGS. 2A–2P are cross-sectional drawings illustrating a sequence of steps for fabricating and planarizing a deep isolation trench in a silicon-on-insulator (SOI) structure in accordance with the concepts of the present invention.

FIG. 2A shows a preliminary silicon-on-insulator (SOI) structure 100 that includes a base semiconductor substrate 102, a buried oxide layer 104 formed on the base semiconductor substrate 102 and an active silicon layer 106 about 20,000–25,000 Å thick formed on the buried insulator layer 104. Those skilled in the art will appreciate that the active silicon layer 106 can comprise an epitaxial layer grown on bonded silicon. FIG. 2A also shows a layer of field oxide 110 about 10,000 Å thick formed on the active silicon 106, a first layer of LPCVD silicon nitride 112 about 2000–3,000 Å thick formed on the layer of field oxide 110 and a layer of deposited hardmask oxide (LTO or TEOS, for example) 114 about 25,000–29,000 Å thick formed on the first layer of LPCVD silicon nitride 112.

(The reason for having a nitride layer 112 on top of the field oxide 110 is as follows. After trench formation, the remaining hardmask oxide 114 is stripped, as discussed in detail below. During subsequent stripping of the hardmask oxide 114, the LPCVD nitride 112 is used as a barrier to protect the underlying field oxide 110 so that the thickness of the field oxide 110 remains uniform.)

Figure 2B:
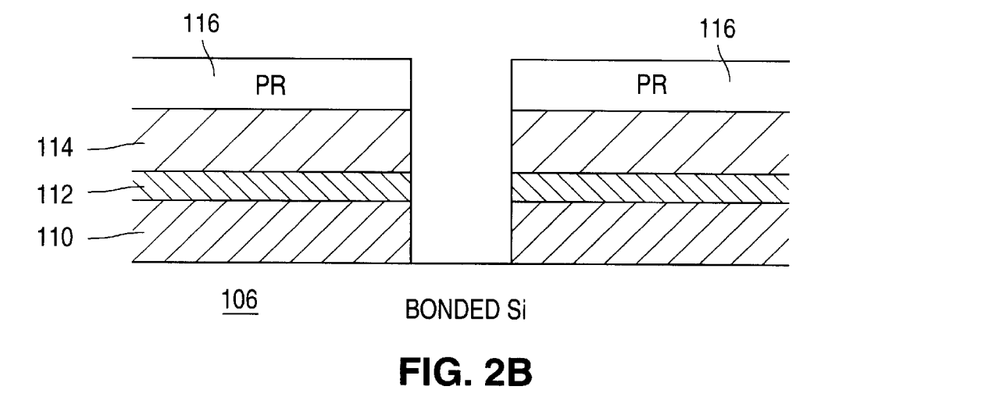

The hardmask oxide 114 is then covered with photoresist 116 and patterned to expose selected surface regions of the hardmask oxide 114. The thickness of the resist 116 is about 2–3 $\mu$, enough to withstand a conventional dry oxide etch. The undoped hardmask oxide 114, first nitride 112 and field oxide 110 are then etched, using the resist mask 116, to expose surface regions of the silicon layer 106, resulting in the structure shown in FIG. 2B. The chemistry utilized to etch the hardmask oxide 114, first nitride 112 and field oxide 110 is selective to active silicon 106.

After resist removal, the wafers are now ready for the trench etch step. An anisotropic silicon etch results in the formation of trenches in the active silicon 106 that extend to the buried oxide layer 104, as shown in FIG. 2C.

Figure 2C:
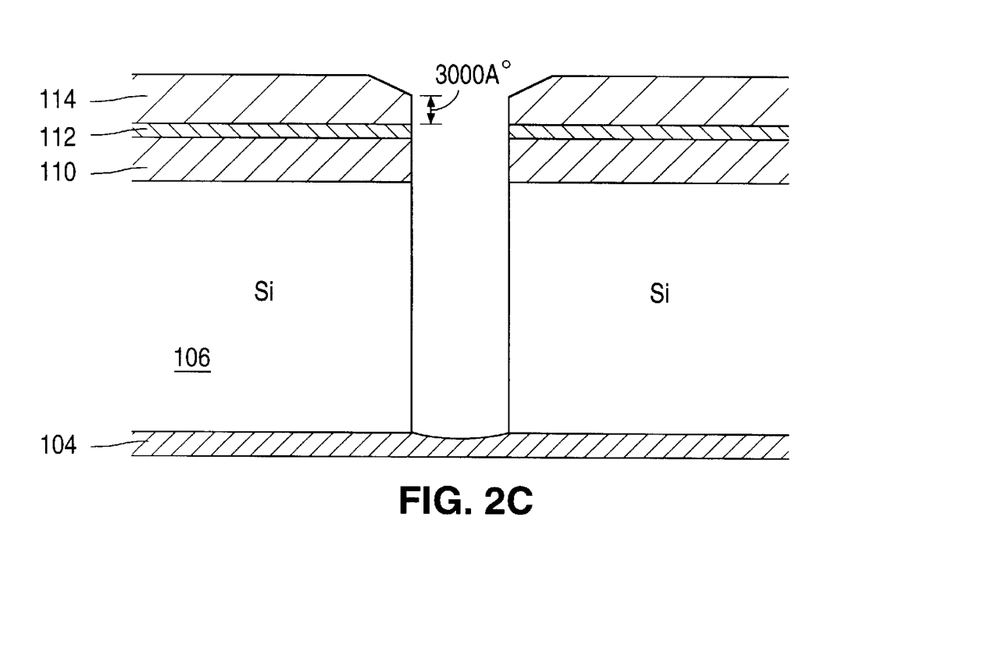

As further shown in FIG. 2C, the initial thickness of the hardmask oxide 114 (approx. 25000–29000 Å in the described embodiment) is chosen such that, after the trench etch, at least a portion of the mask opening in the hardmask oxide 114 (approx. 3000 Å in the described embodiment) remains vertical, i.e., unetched. The reason for this is discussed in greater detail below.

Figure 2D:
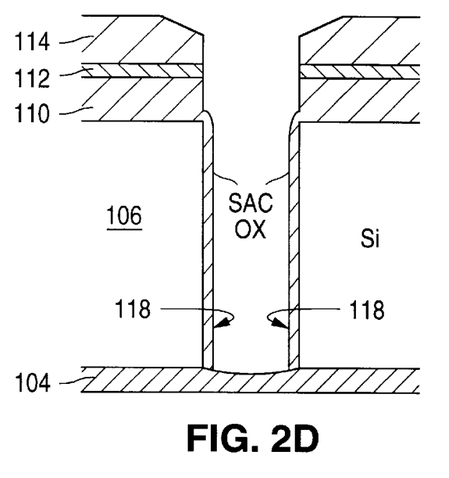
Figure 2E:
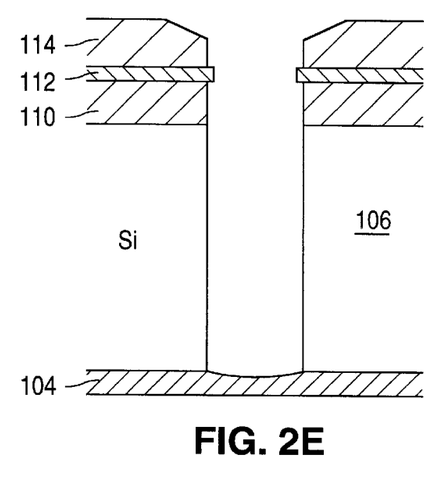

Referring to FIG. 2D, in the preferred embodiment, after trench etch, a thin layer of sacrificial oxide 118 about 600–700 Å thick is grown at high temperature along the trench sidewalls to further remove any damage in the active silicon 106 resulting from the trench etch. The sacrificial oxide 118 is then removed by dipping in an HF or buffered HF etch solution, resulting in the structure shown in FIG. 2E. The wafer should not be in the HF etchant for very long during this step to avoid undercutting the field oxide 110 and etching the buried oxide 104.

Figure 2F:
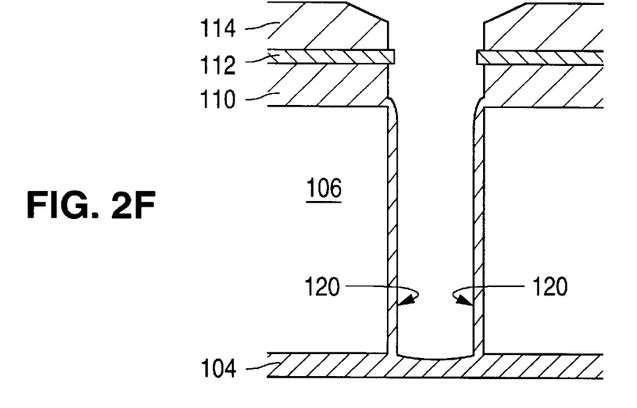

After removing the sacrificial oxide 118, a layer of trench lining oxide 120 is grown on the sidewalls of the trench at about 950°–1150° C., resulting in the structure shown in FIG. 2F.

Figure 2G:
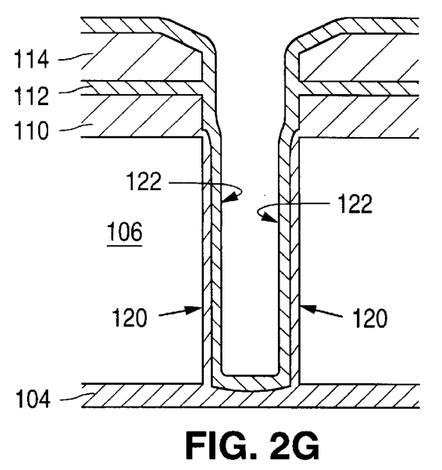
Figure 2H:
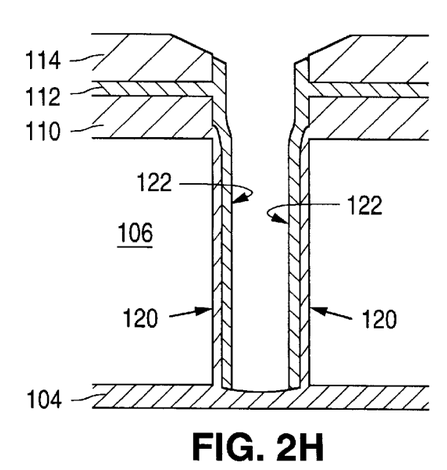

As shown in FIG. 2G, after formation of the trench lining oxide 120, a second layer of LPCVD nitride 122 about 3,000 Å thick is deposited to cover hardmask oxide 114, the trench walls, and buried oxide 104 at the bottom of the trench. This second nitride layer 122 is then anisotropically etched, using an etcher with selectivity between the nitride 122 and underlying buried oxide 104, to remove nitride 122 from the top of the hardmask oxide 114 and from the bottom of the trench, but still leaving a layer of nitride 122 on the vertical portion of the hardmask oxide 114, on the first nitride trench sidewall, on the field oxide trench sidewall, and on the lining oxide on the active silicon trench sidewall, as shown in FIG. 2H. The purpose of this second nitride layer 122 is to seal the field oxide 110 from being etched during the hardmask oxide strip, which occurs at a later step in the process flow.

Figure 2I:
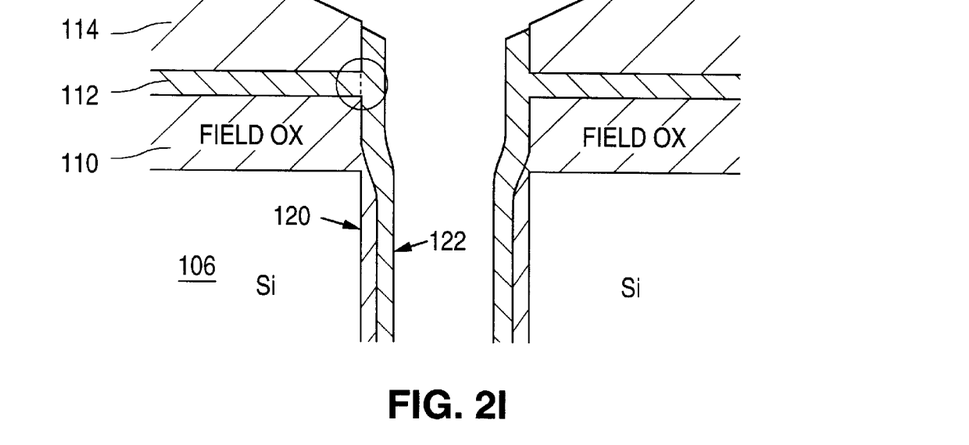

Referring to FIG. 2I, the importance of the nitride spacer etch is to ensure that, after etch, there is enough nitride spacer material 122 remaining above the nitride layer 112 on top of the field oxide 110. To facilitate this, as discussed above, it is important to have part of the undoped hardmask oxide 114 remain vertical after the trench etch. Thus, the initial thickness of the hardmask oxide 114 is chosen based upon the silicon:oxide etch selectivity and the amount of hardmask oxide faceting that will occur during the active silicon trench etch.

Figure 2J:
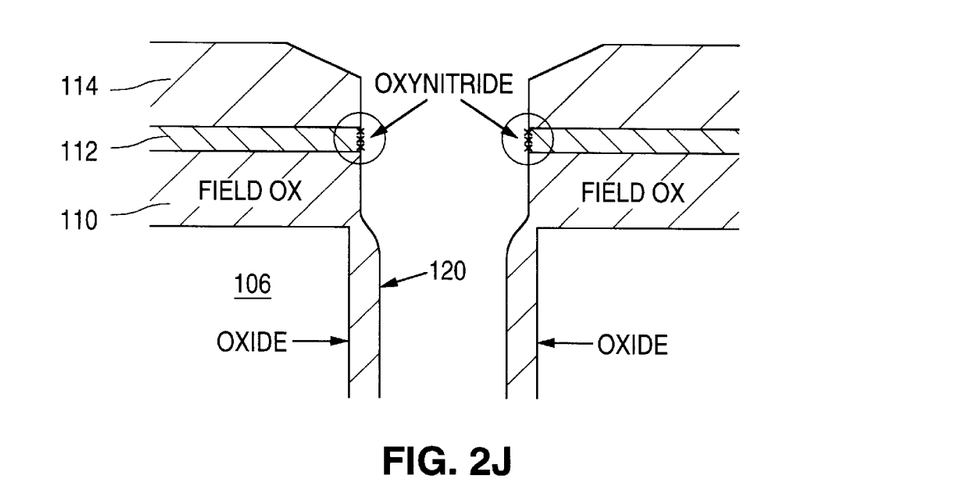

Furthermore, referring to FIG. 2J, to ensure that the interface between the first and second LPCVD nitride layers 112 and 122, respectively, merges, the structure should be dipped in HF or BOE to remove oxynitride remaining on the vertical portion of the first nitride 112 from the formation of lining oxide 120 before the second nitride layer 122 is deposited.

Figure 2K:
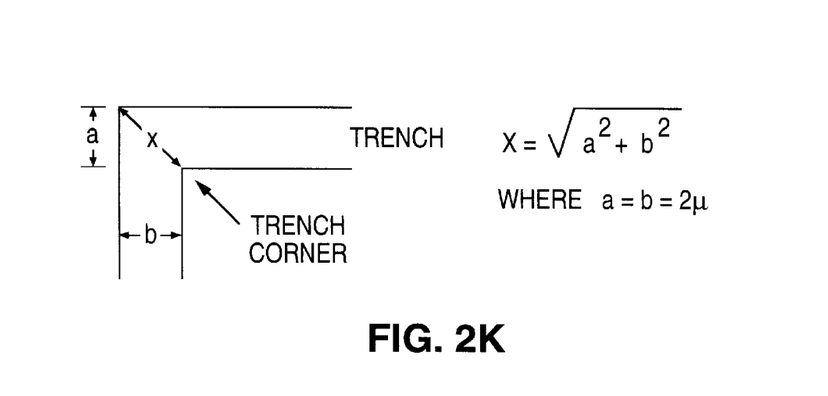
Figure 2L:
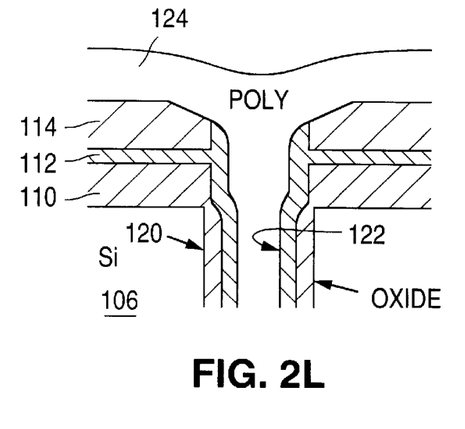

After the nitride spacer etch, the trench is filled by depositing polysilicon 124. The thickness of the polysilicon is selected to ensure that the poly 124 fills the trench everywhere, including at the corners where the diagonal distance, in the disclosed embodiment, is approximately 3 microns (see FIG. 2K). The resulting structure is shown in FIG. 2L.

Figure 2M:
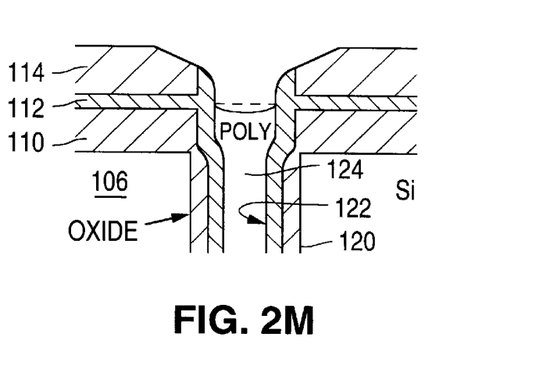

The polysilicon 124 is then etched back to remove poly from the field. The poly etchback is performed using, for example, an isotropic or anisotropic etcher with either a F or $Cl_2$-based etch chemistry. This etch uses an endpoint and adds an overetch so that, as shown in FIG. 2M, polysilicon 124 left in the trench is at a level such that a subsequent oxidation of the trench poly produces an oxide cap that is planar with the field oxide 110.

After the poly etchback, the remaining hardmask oxide 114 is removed. As mentioned above, after trench etch, the remaining hardmask oxide 114 can be quite non-uniform due to the very high selectivity of silicon:oxide in the trench etch process. As further stated above, this is why the underlying nitride layer 112 is used to protect the field oxide 110 during subsequent hardmask removal. Since the hardmask oxide 114 is relatively thick, and the wafer remains in the hardmask strip solution for a relatively long time to completely remove the oxide 114, it is important that the interface between the first nitride 112 and the second nitride 122 is robust.

Figure 2N:
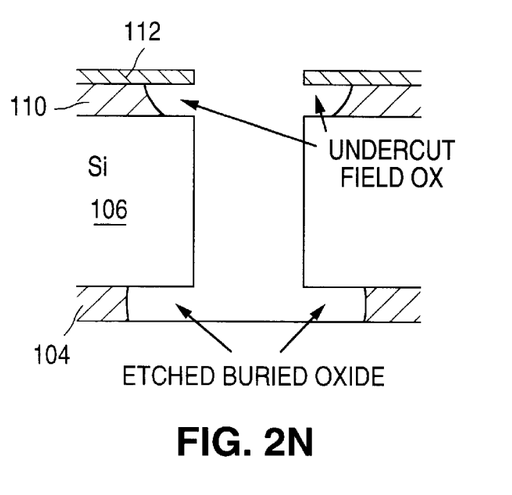

Another important point relating to stripping of the hardmask oxide 114 after filling the trench with poly and poly etchback is as follows: If the hardmask oxide 114 is removed before filling the trench, then the etchant would also etch the buried oxide 104 and cause debonding of the substrate wafer 102. To avoid debonding, the hardmask oxide 114 is stripped after the trench is filled; additionally, the nitride spacer 122 eliminates the problem with field oxide undercutting (see FIG. 2N).

Figure 2O:
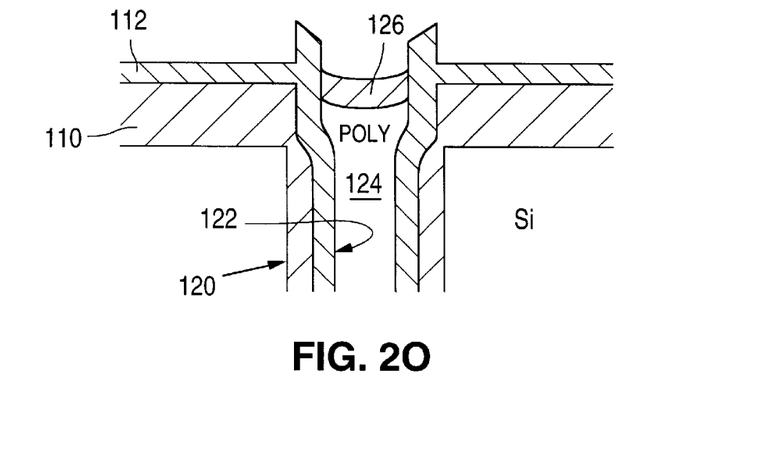

After removing the hardmask oxide 114, the polysilicon 124 is oxidized to form an oxide cap 126 on the top part of the trench, as shown in FIG. 2O. Next, the nitride layer 112 is removed by dipping the wafer in hot phosphoric acid. The trench SOI module is now complete (see FIG. 2P) and the wafer is ready to move on to the next step in the process.

Although the process described above in conjunction with FIGS. 2A–2P provides significant improvements over the prior art, particularly for high-voltage applications, it can result in a nonplanar trench topography. The topography at the top of the trench could cause problems with poly etchback and metal etch to leave metal stringers behind and, possibly, short the devices.

Figure 3A:
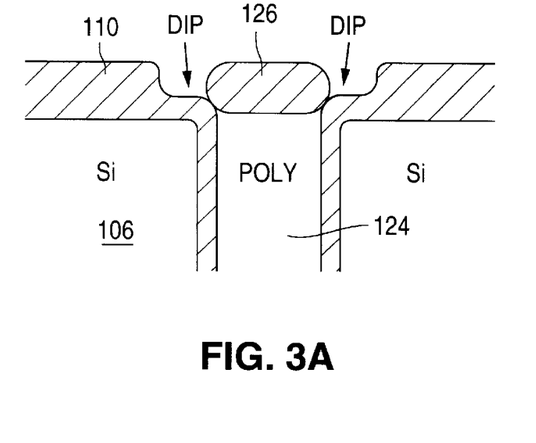
FIGS. 3A–3C are cross-sectional drawings illustrating potential problems resulting from etchback removal of the nitride layer.
Figure 3B:
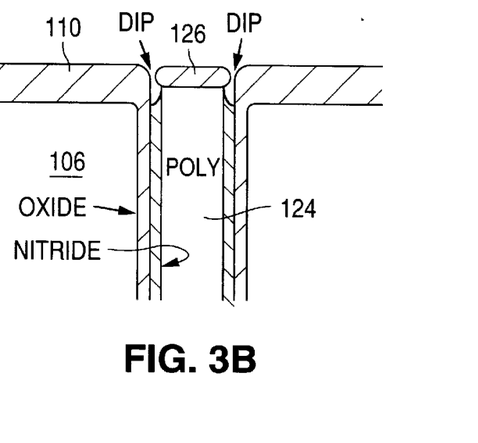
Figure 3C:
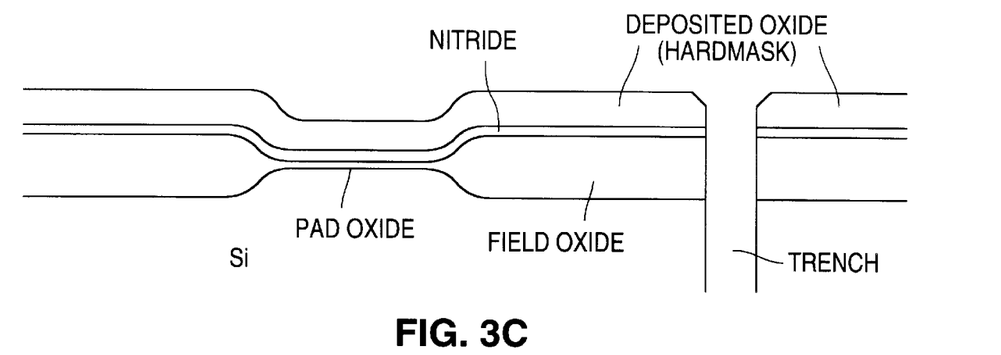

There is also concern that, during the last step of the trench process, which is a nitride removal step, the wet, hot phosphoric acid etch could overetch the nitride causing dipping of the trench corners, as shown in FIGS. 3A and 3B. To eliminate this potential problem, a dry, plasma etch of the nitride layer with endpoint detection could be used. Referring to FIG. 3C, the plasma may damage the pad oxide in the active areas and thin the pad oxide down slightly. To address this potential problem, after nitride plasma etch, one could remove the pad oxide (approximately 850 Å thick) in the active areas (field oxide would also be etched) and then regrow a better quality pad oxide afterwards.

Figure 4A:
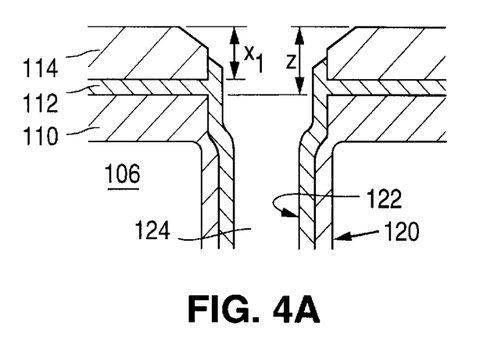
FIGS. 4A and 4B are cross-sectional drawings illustrating potential planarization problems arising from trench polysilicon etchback.
Figure 4B:
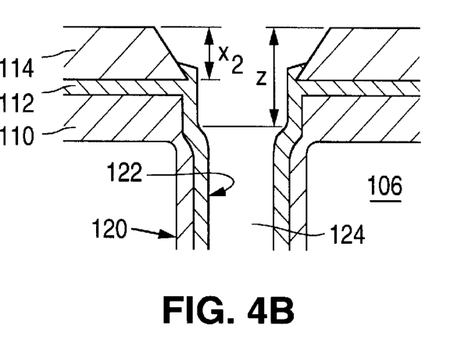

As discussed above, the previous device architectures have the following two disadvantages. First, the remaining hardmask oxide after the trench etch is non-uniform across the wafer. Second, the trenches have to be filled before removing the hardmask oxide to protect the buried oxide during etching. This leads to problems with the poly etchback, as described above. Namely, the depth of the poly etchback down in the trench is dependent upon the thickness of the hardmask oxide, but the hardmask oxide thickness may not be uniform after trench etch; therefore, it is difficult to control the poly etch-back process. As shown in FIGS. 4A and 4B, wherein X1 is greater than X2, and thickness Z is constant, this problem can cause an unplanarized trench, which leads to metal bridging.

The following describes an alternative process flow in which the hardmask oxide is removed before the poly fill and etchback. Thus, the poly is deposited on an even surface (i.e., the surface of the as-deposited first nitride) and the poly etchback planarity is better controlled across the wafer.

The new process feature that allows hardmask oxide removal prior to trench fill without disturbing the buried oxide 104 is modification of the nitride spacer etch such that it leaves nitride at the bottom of the trench, thereby protecting the buried oxide 104.

The alternative process flow is illustrated in FIGS. 5A–5F.

Figure 5A:
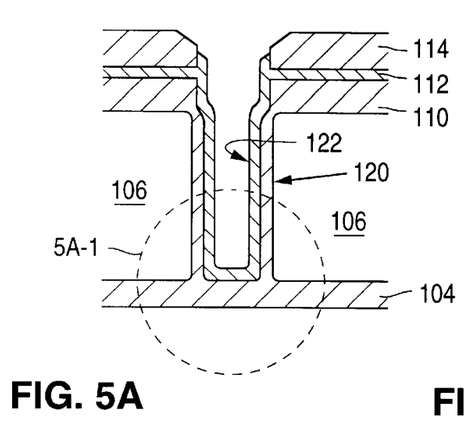
FIGS. 5A–5F are cross-sectional drawings illustrating a sequence of steps for fabricating and planarizing a deep isolation trench in a silicon-on-insulator (SOI) structure in accordance with an alternative embodiment of the present invention.
Figure 5A:
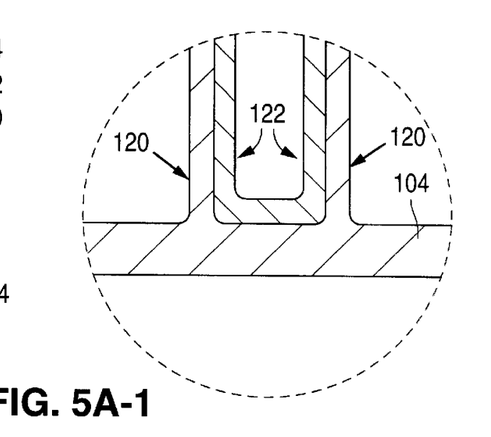

The alternative process begins with the structure that results from completion of the same steps as described above with respect to FIGS. 2A–2G. However, as shown in FIG. 5A, after the second nitride layer 122 is deposited and after the nitride spacer etch, a thin layer of second nitride 122 still remains at the bottom of the trench (shown in detail in FIG. 5A-1). In the process flow described above, the second nitride was completely removed from the bottom of the trench, exposing the buried oxide 104 (see FIG. 2H). However, in accordance with the concepts of the FIG. 5A–5F embodiment of the invention, aspect ratio dependent etching (ARDE) is utilized to perform the nitride spacer etch to remove second nitride 122 from the deposited oxide 114 while leaving second nitride on the buried oxide 104 at the bottom of the trench. More specifically, if, for example, a high power (e.g., 300 W), low pressure (e.g., 90 mT) reactive ion etch (RIE) is required to overcome "RIE lag" to remove second nitride 122 from the bottom of the trench in the FIG. 2H step described above, then lowering the power (e.g., to 200 W) and increasing the pressure (e.g., to 225 mT) increases the angular distribution of the etch species, thereby increasing the effect of RIE lag. Increased RIE lag results in less effective etching at the bottom of the trench, thereby causing nitride 122 to remain on the buried oxide 104 at the bottom of the trench while nitride 122 is completely removed from the deposited oxide 114.

Figure 5B:
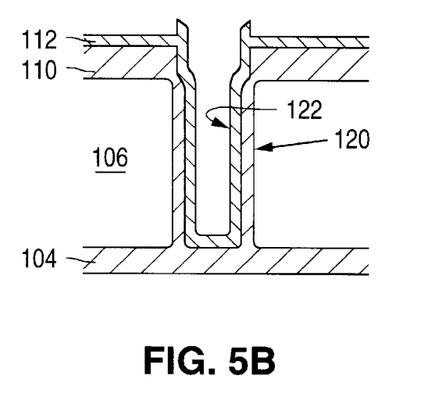
Figure 5C:
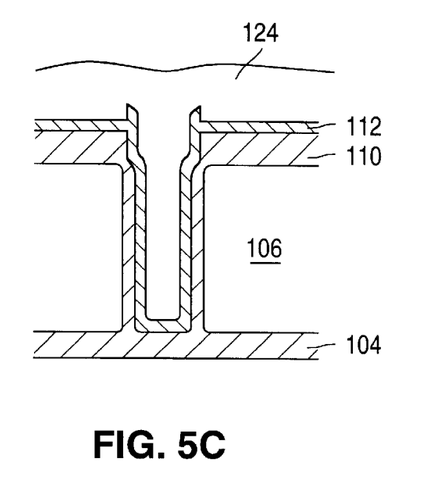
Figure 5D:
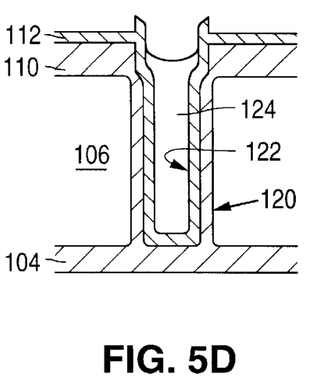
Figure 5E:
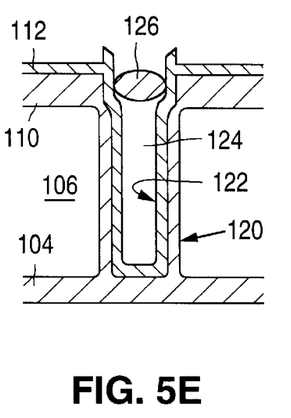
Figure 5F:
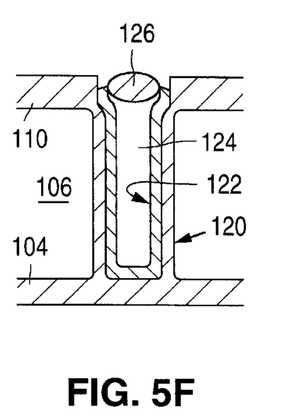

After the nitride spacer etch in accordance with these RIE lag concepts, the hardmask oxide 114 is removed as shown in FIG. 5B and polysilicon layer 124 is deposited, as described above, resulting in the structure shown in FIG. 5C. The poly 124 is then etched back (see FIG. 5D), oxidized (see FIG. 5E) and the first nitride 112 is stripped, resulting in the structure shown in FIG. 5F.

Figure 2P:
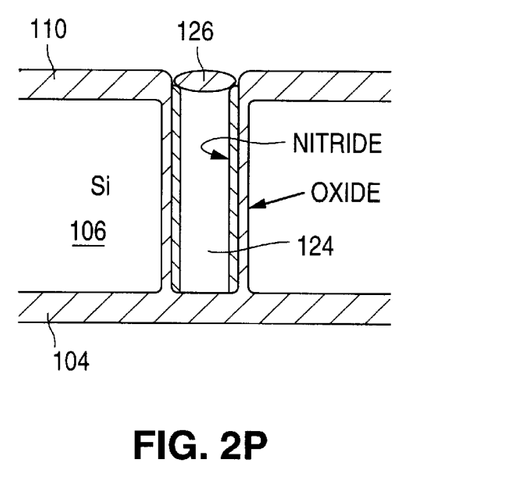

Note that the architecture resulting from the FIG. 2A–2P process would have worked well if the remaining hardmask oxide after trench etch was uniform. With the limitations of existing equipment and the time required to develop new etch processes, the alternative flow of FIGS. 5A–5F is a viable option.

Figure 6A:
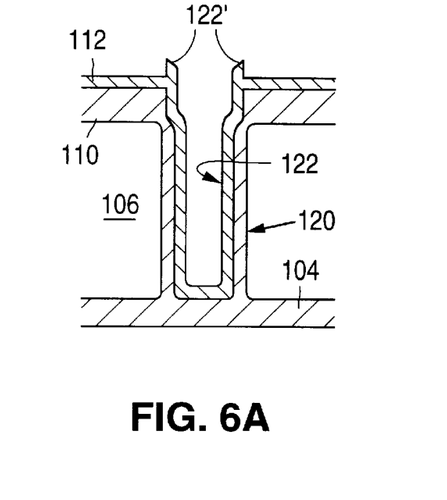
FIGS. 6A–6E are cross-sectional drawings illustrating a sequence of steps for fabricating and planarizing a deep isolation trench in a silicon-on-insulator (SOI) structure in accordance with a second alternative embodiment of the present invention.
Figure 6B:
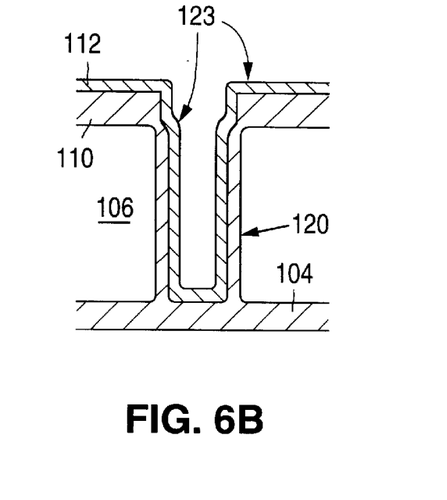
Figure 6C:
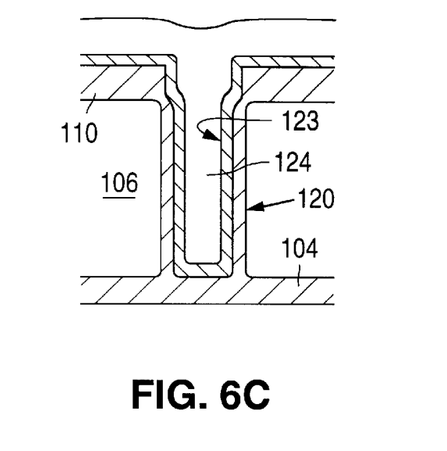
Figure 6D:
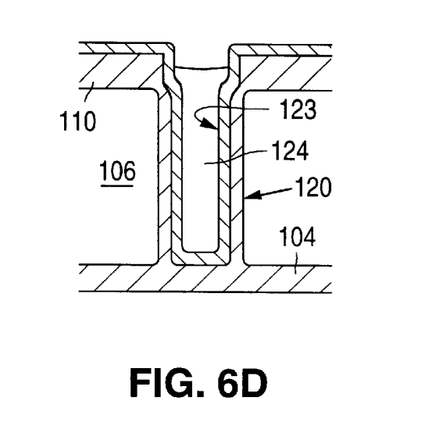
Figure 6E:
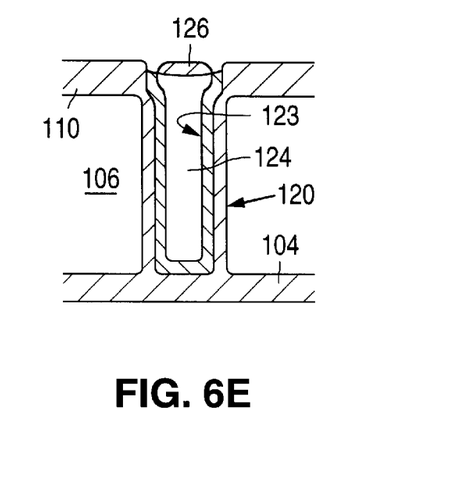
Figure 7A:
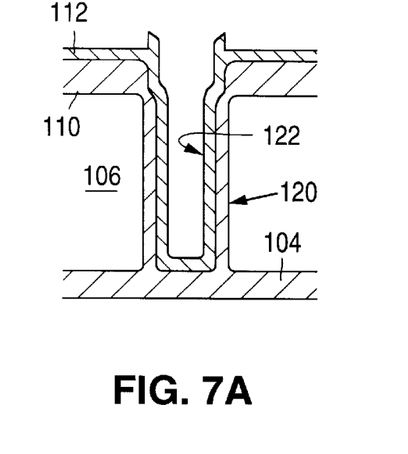
FIGS. 7A–7E are cross-sectional drawings illustrating a sequence of steps for fabricating and planarizing a deep isolation trench in a silicon-on-insulator (SOI) structure in accordance with a third alternative embodiment of the invention.
Figure 7B:
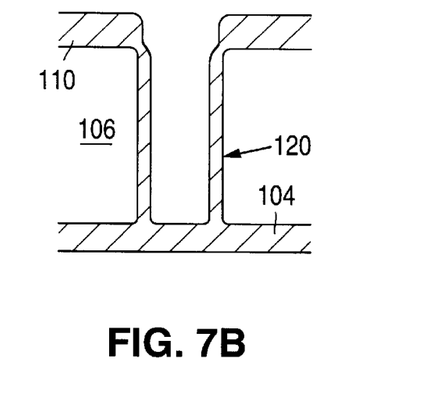
Figure 7C:
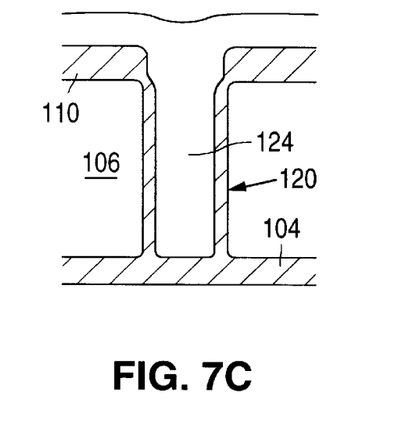
Figure 7D:
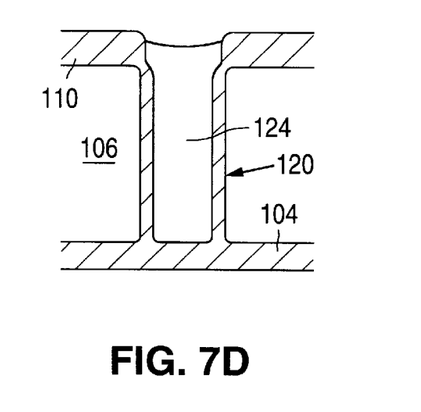
Figure 7E:
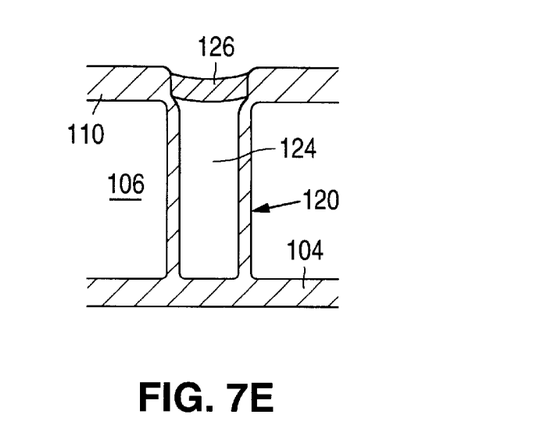

Another alternative process flow, shown in FIGS. 6A–6E, completely strips the first and second nitride layers 112 and 122 after removal of hardmask oxide 114 and prior to poly deposition to remove the "bat ears" 122' at the top of the mask opening, and then redeposits a new nitride layer 123 (FIG. 6B). Redeposition of third nitride 123 is followed by poly deposition (FIG. 6C) and etchback (FIG. 6D) and, finally, growth of oxide cap 126 and removal of the third nitride 123 in the field (FIG. 6E).

Yet another alternative to the flow shown in FIGS. 2A–2P is to completely strip the first and second nitride layers 112 and 122 after hardmask oxide removal, as shown in FIGS. 7A–7E, rather than waiting to etch back the first nitride at the end of the process. A possible disadvantage is that this could cause oxide encroachment at the trench opening during the poly oxidation. However, an advantage lies in the fact that there is no nitride lining in the trench which could possibly cause stress and defects.

Figure 8A:
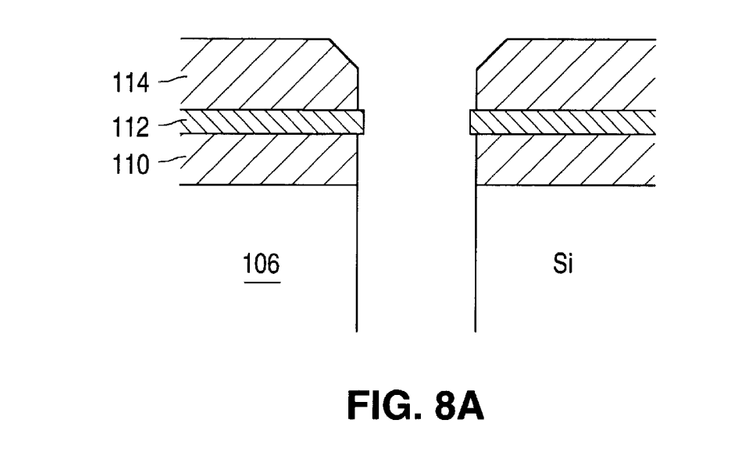
FIGS. 8A–8D are cross-sectional drawings that facilitate discussion of process steps for fabricating a fully vertical layer of second LPCVD nitride on the trench lining oxide in each of the disclosed process flows in accordance with an aspect of the present invention.
Figure 8B:
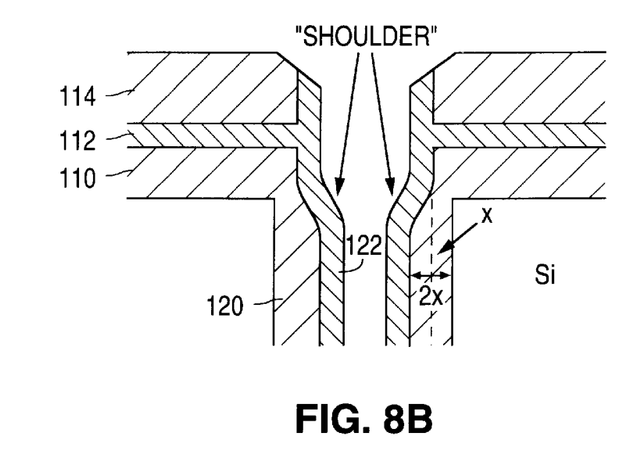

In each of the process flows discussed above, an anisotropic trench etch is utilized, resulting in the structure shown in FIG. 8A. However, if a fully anisotropic etch is used to provide the vertical trench sidewall shown in FIG. 8A, then subsequent growth of trench lining oxide 120 will result in consumption of "x" amount of active silicon 106 to generate lining oxide of approximately "2x" thickness. Therefore, deposition of the second nitride layer 122 can result in formation of a nitride "shoulder" at the juncture between the field oxide 110 and the lining oxide 120, as shown in FIG. 8B. Removal of the second nitride 122 from the horizontal surfaces of the hardmask oxide 114 using an anisotropic etch could also result in unacceptable degradation of the nitride 122 at the shoulder.

Figure 8C:
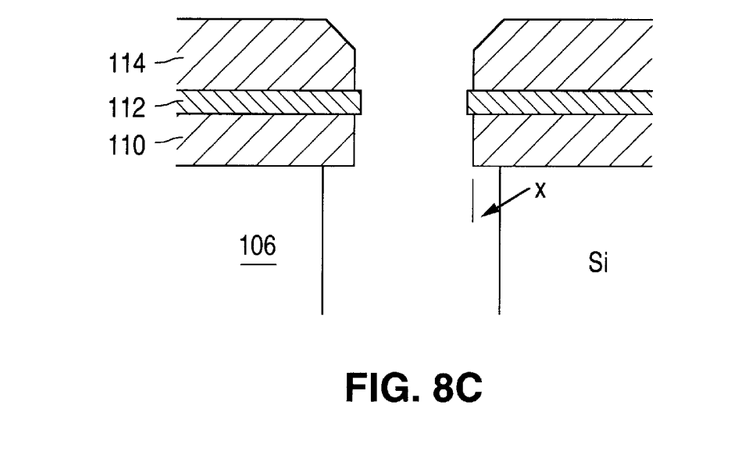
Figure 8D:
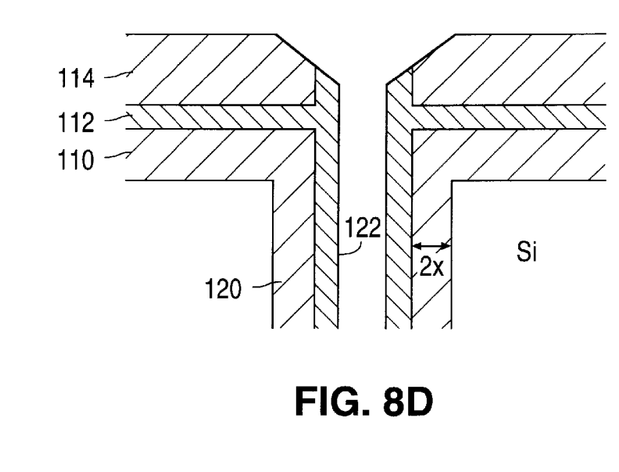

To avoid this problem, each of the above-disclosed processes could be modified to replace the anisotropic etch with an anisotropic etch with a small isotropic component which, as shown in FIG. 8C, consumes "x" amount of active silicon 106 beneath the field oxide 110. Subsequent oxidation of an additional amount "x" of active silicon 106 to generate lining oxide 120 of "2x" thickness, followed by deposition and anisotropic etchback of second nitride 122, would result in the vertical sidewall structure shown in FIG. 2D, thereby eliminating the nitride shoulder and its associated potential problems.

Alternatively, controlled growth of the sacrificial oxide 118 after the anisotropic trench etch step (see FIG. 2D) to consume an amount "x" of active silicon 106 would provide a similar result.

Of course, those skilled in the art will appreciate that combinations of anisotropic etching, isotropic etching and controlled growth of sacrificial oxide can also be used to eliminate the nitride "shoulder" and achieve the desired result.

It should be understood that various alternatives to the embodiments of the invention described herein may be employed in practicing the invention. Thus, it is intended that the following claims define the scope of the invention and that methods within the scope of these claims and their equivalents be covered thereby.

What is claimed is:

1. A method of forming and planarizing a silicon-on-insulator (SOI) structure, the SOI structure including a base semiconductor substrate, a buried insulator layer formed on the base semiconductor substrate and an active silicon layer formed on the buried insulator layer, the method comprising:

forming an oxide/nitride/oxide (ONO) layer on the active silicon layer, the ONO layer including a layer of field oxide formed on the active silicon substrate, a first layer of silicon nitride formed on the layer of field oxide, and a layer of deposited oxide formed on the first layer of silicon nitride;

forming a layer of photoresist on the deposited oxide layer;

forming an opening in the photoresist layer to expose a surface portion of the deposited oxide layer;

etching the exposed surface portion of the deposited oxide layer, the underlying first layer of silicon nitride and the underlying layer of field oxide to expose a surface portion of the active silicon layer;

stripping the layer of photoresist;

etching the exposed surface portion of the active silicon layer to form a trench in the active silicon layer that extends to the buried oxide layer such that the bottom of the trench is buried oxide and such that the deposited oxide layer maintains a vertical sidewall portion;

forming a layer of trench lining oxide on the sidewalls of the trench;

depositing a second layer of silicon nitride on exposed surfaces of the deposited oxide layer, on exposed surfaces of the first layer of silicon nitride, on exposed surfaces of the layer of field oxide, on the layer of trench lining oxide and on the bottom of the trench;

anisotropically etching the second layer of silicon nitride to remove the second layer of silicon nitride from the exposed horizontal surfaces of the deposited oxide layer and the buried oxide in the bottom of the trench, but leaving silicon nitride on the vertical sidewall portions of the deposited oxide layer, on the sidewalls of the first nitride layer, on the sidewalls of the field oxide and on the trench lining oxide;

depositing a layer of polysilicon to fill the trench;

etching the layer of polysilicon back;

removing the deposited oxide layer;

forming an oxide cap on the polysilicon remaining in the trench after the polysilicon etchback step; and removing the first layer of silicon nitride from the field oxide layer.

2. A method as in claim 1 and wherein the step of etching the exposed surface of the active silicon layer is an anisotropic etch step that results in the trench having vertical sidewalls that correspond to the vertical sidewall portions of the deposited oxide layer.

3. A method as in claim 1 and wherein the step of etching the exposed surface of the active silicon layer results in consumption of the active silicon layer such that the step of forming a layer of trench lining oxide results in the trench lining oxide having vertical sidewalls corresponding to the vertical sidewall portions of the deposited oxide layer.

4. A method as in claim 1 and wherein the step of forming a layer of sacrificial oxide results in consumption of the active silicon layer such that the trench lining oxide has vertical sidewalls corresponding to the vertical sidewall portions of the field oxide layer.

5. A method as in claim 1 and wherein the step of removing the first layer of silicon nitride utilizes a wet chemical etch solution.

6. A method as in claim 5 and wherein the wet chemical etch solution is hot phosphoric acid.

7. A method as in claim 1 and wherein the step of removing the first layer of silicon nitride comprises a dry plasma etch with endpoint detection.

8. A method as in claim 7 and wherein the dry plasma etch step is immediately followed by removal of pad oxide and regrowth of a new pad oxide.

9. A method of forming and planarizing a silicon-on-insulator (SOI) structure, the SOI structure including a base semiconductor substrate, a buried insulator layer formed on the base semiconductor substrate and an active silicon layer formed on the buried insulator layer, the method comprising:

forming an oxide/nitride/oxide (ONO) layer on the active silicon layer, the ONO layer including a layer of field oxide formed on the active silicon substrate, a first layer of silicon nitride formed on the layer of field oxide, and a layer of deposited oxide formed on the first layer of silicon nitride;

forming a layer of photoresist on the deposited oxide layer;

forming an opening in the photoresist layer to expose a surface portion of the deposited oxide layer;

etching the exposed surface portion of the deposited oxide layer, the underlying first layer of silicon nitride and the underlying layer of field oxide to expose a surface portion of the active silicon layer;

stripping the layer of photoresist;

etching the exposed surface portion of the active silicon layer to form a trench in the active silicon layer that extends to the buried oxide layer such that the bottom of the trench is buried oxide and such that the deposited oxide layer maintains a vertical sidewall portion;

forming a layer of trench lining oxide on the sidewalls of the trench;

depositing a second layer of silicon nitride on exposed surfaces of the deposited oxide layer, on exposed surfaces of the first layer of silicon nitride, on exposed surfaces of the layer of field oxide, on the layer of trench lining oxide and on the bottom of the trench;

etching the second layer of silicon nitride to remove the second layer of silicon nitride from the exposed surfaces of the deposited oxide layer but leaving silicon nitride on the vertical sidewall portions of the deposited oxide layer, on the sidewalls of the first nitride layer, on the sidewalls of the field oxide, on the trench lining oxide and on the bottom of the trench;

removing the deposited oxide layer;

depositing a layer of polysilicon to fill the trench;

etching the layer of polysilicon back;

forming an oxide cap on the polysilicon remaining in the trench after the polysilicon etchback step; and removing the first layer of silicon nitride from the field oxide layer.

10. A method as in claim 9 and wherein the step of etching the exposed surface portion of the active silicon layer is an anisotropic etch step that results in the trench having vertical sidewalls that correspond to the vertical sidewall portions of the deposited oxide layer.

11. A method as in claim 9 and wherein the step of etching the exposed surface of the active silicon layer results in consumption of the active silicon layer such that the step of forming a layer of trench lining oxide results in the trench lining oxide having vertical sidewalls corresponding to the vertical sidewall portions of the deposited oxide layer.

12. A method as in claim 9 and wherein the step of forming a layer of sacrificial oxide results in consumption of the active silicon layer such that the trench lining oxide has vertical sidewalls corresponding to the vertical sidewall portions of the field oxide layer.

13. A method of forming and planarizing a silicon-on-insulator (SOI) structure, the SOI structure including a base semiconductor substrate, a buried insulator layer formed on the base semiconductor substrate and an active silicon layer formed on the buried insulator layer, the method comprising:

forming an oxide/nitride/oxide (ONO) layer on the active silicon layer, the ONO layer including a layer of field oxide formed on the active silicon substrate, a first layer of silicon nitride formed on the layer of field oxide, and a layer of deposited oxide formed on the first layer of silicon nitride;

forming a layer of photoresist on the deposited oxide layer;

forming an opening in the photoresist layer to expose a surface portion of the deposited oxide layer;

etching the exposed surface portion of the deposited oxide layer, the underlying first layer of silicon nitride and the underlying layer of field oxide to expose a surface portion of the active silicon layer;

stripping the layer of photoresist;

etching the exposed surface portion of the active silicon layer to form a trench in the active silicon layer having that extends to the buried oxide layer such that the bottom of the trench is buried oxide and such that the deposited oxide layer maintains a vertical sidewall portion;

forming a layer of trench lining oxide on the sidewalls of the trench;

depositing a second layer of silicon nitride on exposed surfaces of the deposited oxide layer, on exposed surfaces of the first layer of silicon nitride, on exposed surfaces of the layer of field oxide, on the layer of trench lining oxide and on the bottom of the trench;

etching the second layer of silicon nitride to remove the second layer of silicon nitride from the exposed surfaces of the deposited oxide layer but leaving silicon nitride on the vertical sidewall portions of the deposited oxide layer, on the sidewalls of the first nitride layer, on the sidewalls of the field oxide, on the trench lining oxide and on the bottom of the trench;

removing the deposited oxide layer;

removing the first layer of silicon nitride from the field oxide layer and the remainder of the second layer of silicon nitride;

depositing a third layer of silicon nitride on the structure resulting from the above steps;

depositing a layer of polysilicon to fill the trench;

etching the layer of polysilicon back;

forming an oxide cap on the polysilicon that remains in the trench after the polysilicon etchback step; and removing the third layer of silicon nitride from the field oxide layer.

14. A method as in claim 13 and wherein the step of etching the exposed portions of the active silicon layer is an anisotropic etch step that results in the trench having vertical sidewalls that correspond to the vertical sidewall portions of the deposited oxide layer.

15. A method as in claim 13 and wherein the step of etching the exposed surface of the active silicon layer results in consumption of the active silicon layer such that the step of forming a layer of trench lining oxide results in the trench lining oxide having vertical sidewalls that correspond to the vertical sidewall portions of the deposited oxide layer.

16. A method as in claim 13 and wherein the step of forming a layer of sacrificial oxide results in the consumption of the active silicon layer such that the trench lining oxide has vertical sidewalls corresponding to the vertical sidewall portions of the field oxide layer.

17. A method of forming and planarizing a silicon-on-insulator (SOI) structure, the SOI structure including a base semiconductor substrate, a buried insulator layer formed on the base semiconductor substrate and an active silicon layer formed on the buried insulator layer, the method comprising:

forming an oxide/nitride/oxide (ONO) layer on the active silicon layer, the ONO layer including a layer of field oxide formed on the active silicon substrate, a first layer of silicon nitride formed on the layer of field oxide, and a layer of deposited oxide formed on the first layer of silicon nitride;

forming a layer of photoresist on the deposited oxide layer;

forming an opening in the photoresist layer to expose a surface portion of the deposited oxide layer;

etching the exposed surface portion of the deposited oxide layer, the underlying first layer of silicon nitride and the underlying layer of field oxide to expose a surface portion of the active bonded silicon layer;

stripping the layer of photoresist;

etching the exposed surface portion of the active silicon layer to form a trench in the active silicon layer that extends to the buried oxide layer such that the bottom of the trench is buried oxide and such that the deposited oxide layer maintains a vertical sidewall portion;

forming a layer of trench lining oxide on the sidewalls of the trench;

depositing a second layer of silicon nitride on exposed surfaces of the deposited oxide layer, on exposed surfaces of the first layer of silicon nitride, on exposed surfaces of the layer of field oxide, on the layer of trench lining oxide and on the bottom of the trench;

etching the second layer of silicon nitride to remove the second layer of silicon nitride from the exposed surfaces of the deposited oxide layer but leaving silicon nitride on the vertical sidewall portions of the deposited oxide layer, on the sidewalls of the first nitride layer, on the sidewalls of the field oxide, on the trench lining oxide and on the bottom of the trench;

removing the deposited oxide layer;

removing the first layer of silicon nitride from the field oxide layer and the remainder of the second layer of silicon nitride;

depositing a layer of polysilicon to fill the trench;

etching the layer of polysilicon back; and forming an oxide cap on the polysilicon that remains in the trench after the polysilicon etchback step.

18. A method as in claim 17 and wherein the step of etching the exposed portions of the active silicon layer is an anisotropic etch step that results in the trench having vertical sidewalls corresponding to the vertical sidewall portions of the deposited oxide layer.

19. A method as in claim 17 and wherein the step of etching the exposed surface of the active silicon layer results in the consumption of the active silicon layer such that the step of forming a layer of trench lining oxide results in the trench lining oxide having vertical sidewalls corresponding to the vertical sidewall portions of the deposited oxide layer.

20. A method as in claim 17 and wherein the step of forming a layer of sacrificial oxide results in consumption of the active silicon layer such that the trench lining oxide has vertical sidewalls corresponding to the vertical sidewall portions of the field oxide layer.

* * * * *

UNITED STATES PATENT AND TRADEMARK OFFICE
CERTIFICATE OF CORRECTION

PATENT NO. : 5,811,315
DATED : September 22, 1998
INVENTOR(S) : Wipawan Yindeepol et al It is certified that error appears in the above-identified patent and that said Letters Patent is hereby corrected as shown below:

On the title page: Item [54] delete "METHOD" and replace with --METHODS--.

Column 1, line 3, delete "METHOD" and replace with --METHODS--.

Column 10, line 20, delete "having".

Signed and Sealed this

Second Day of February, 1999

Attest:

Attesting Officer

*Acting Commissioner of Patents and Trademarks*